United States Patent [19]

Sano et al.

[11] Patent Number: 4,724,387

[45] Date of Patent: Feb. 9, 1988

[54] METHOD AND APPARATUS FOR HIGH RESOLUTION NUCLEAR MAGNETIC RESONANCE IMAGING

[75] Inventors: Koichi Sano; Shimbu Yamagata, both of Yokohama; Hideaki Koizumi, Katsuta, all of Japan

[73] Assignee: Hitachi, Ltd., Japan

[21] Appl. No.: 792,273

[22] Filed: Oct. 28, 1985

[30] Foreign Application Priority Data

Oct. 31, 1984 [JP] Japan .................................. 59-227728

[51] Int. Cl.$^4$ ............................................ G01R 33/20
[52] U.S. Cl. .................................................... 324/309
[58] Field of Search ......................................... 324/309

[56] References Cited

U.S. PATENT DOCUMENTS 4,587,489  5/1986  Wehili ................................. 324/309
4,593,247  6/1986  Glover ............................ 324/307 X Primary Examiner—Tom Noland
Attorney, Agent, or Firm—Antonelli, Terry & Wands

[57] ABSTRACT

In a nuclear magnetic resonance imaging method and apparatus, the center position of each of a plurality of gradient magnetic fields are controlled to shift the positions of sampling points in a plurality of reconstructed images of the same part so that they do not overlap with each other in a sampling interval. As the result, the number of sampling points is effectively increased, thereby increasing the spacial resolving power of reconstructed images by NMR signals.

2 Claims, 5 Drawing Figures

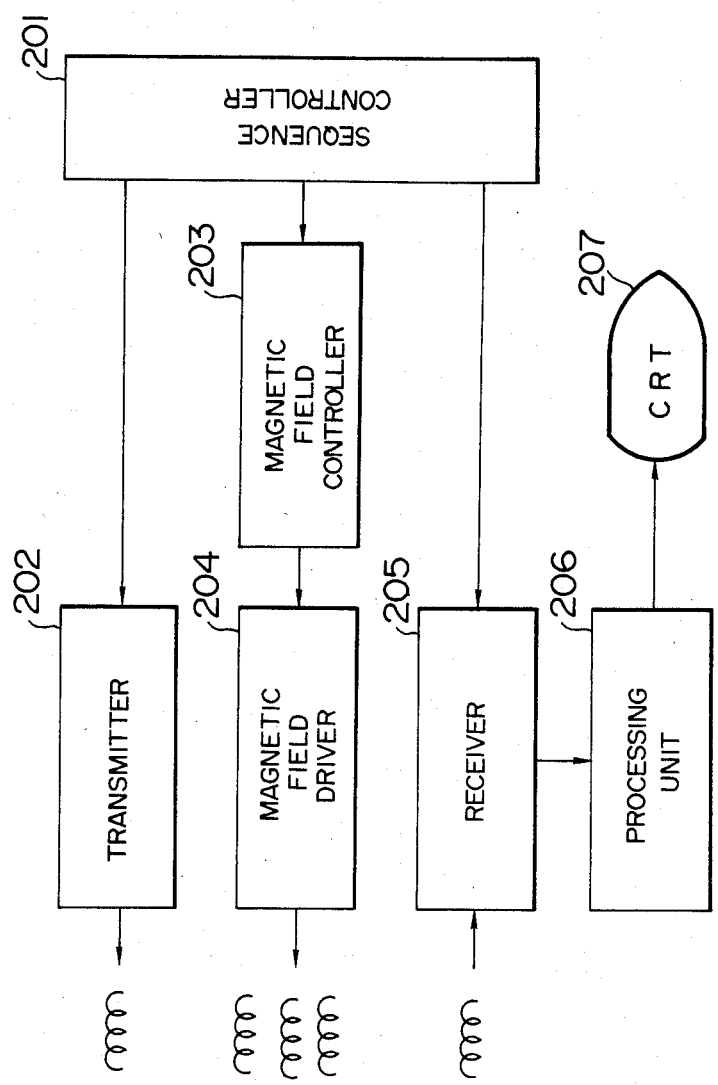

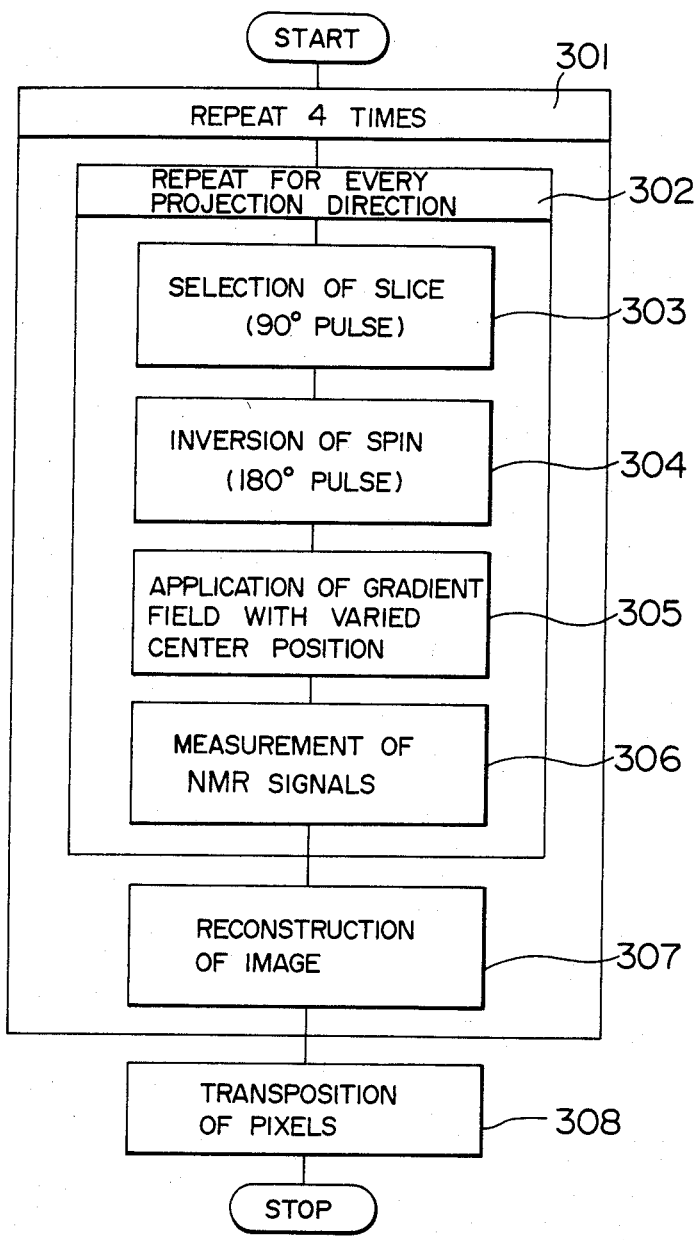

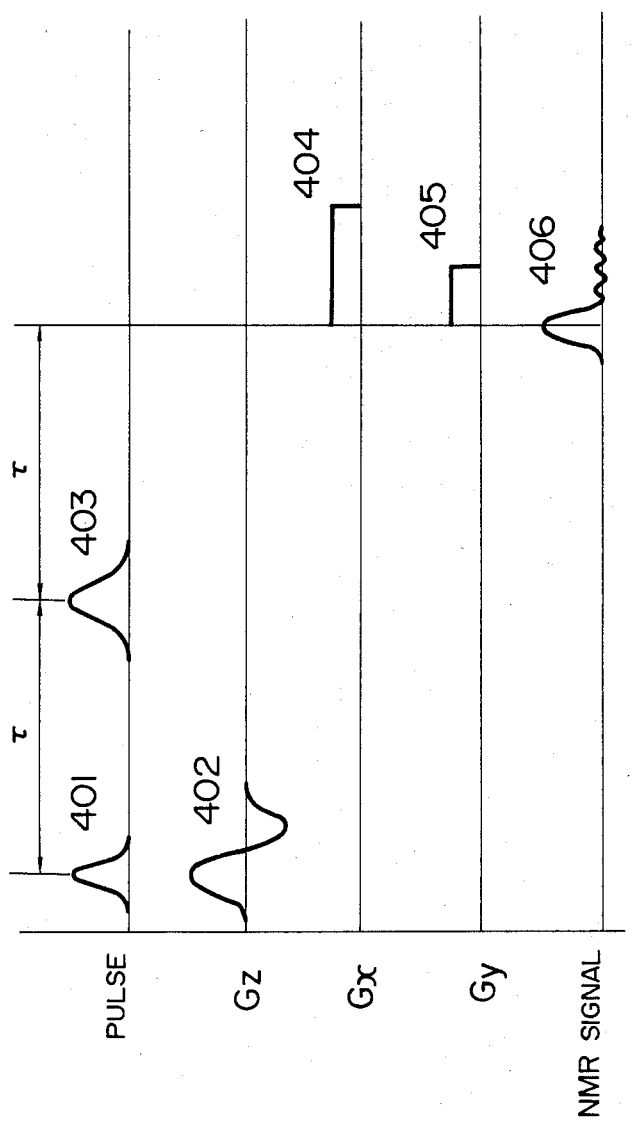

METHOD AND APPARATUS FOR HIGH RESOLUTION NUCLEAR MAGNETIC RESONANCE IMAGING

BACKGROUND OF THE INVENTION

This invention relates to a method and an apparatus for imaging a section of a human body by means of nuclear magnetic resonance phenomena, and more specifically to a method and an apparatus for high resolution nuclear magnetic resonance imaging suitable for medical diagnoses and/or treatments.

A signal detected by an NMR imaging apparatus is called an NMR signal which is produced when a nuclear spin returns from an energy level in a stage thereof excited by a resonance signal to that in its ground state.

The detected signal can be represented by the following equation:

$$f(t) = K \int \vec{M_0}(\vec{x}) \exp[-i\gamma \vec{G} \cdot \vec{x} t] \cdot \exp\left(-\frac{t}{T_2(\vec{x})}\right) d\vec{x} \quad (1)$$

where
$\vec{M_0}(\vec{x})$: magnetic field intensity at time 0
$\vec{G}$: gradient magnetic field
$T_2(\vec{x})$: transverse relaxation time
$K$: proportionality constant
$\gamma$: nuclear magnetic rotation ratio As it can be seen from equation (1), the detected signal decreases exponentially with a time constant of the transverse relaxation time $T_2(\vec{x})$ (hereinbelow abbreviated simply to $T_2$). $T_2$ is usually of an order of magnitude of $10^{-5} \sim 1$ second. However, by influences of inhomogeneity of the magnetic field the actual decrease time constant $T_2^*$ is changed as follows:

$$\frac{1}{T_2^*} = \frac{1}{T_2} + \gamma \frac{\Delta H}{2} \quad (2)$$

where $\Delta H$ is inhomogeneity of magnetic field. That is, since $T_2^* \leq T_2$, the time constant becomes further smaller and the detected signal decreases more rapidly.

On the other hand, the resolving power for images is determined by a sampling interval $\Delta \omega$ after the Fourier transformation of the NMR signal. Representing a measureing time by $T$, the following relationship is satisfied:

$$\Delta \omega = 2\pi/T \quad (3)$$

Further, for an NMR imaging apparatus, the gradient magnetic field $G$, a spatial sampling width $\Delta Z$ and the frequency sampling interval $\Delta \omega$ satisfy the following relationship:

$$\Delta \omega = \gamma G \Delta z$$

Then, $\Delta z$ can be expressed as follows:

$$\Delta z = 2\pi/\gamma T G \quad (4)$$

That is, $\Delta z$ becomes smaller and the spatial resolving power increases with increase in the gradient magnetic field $G$ and increase in the measuring time $T$.

However, when the gradient magnetic field $G$ is increased, the inhomogeneity of magnetic field becomes larger and hence the decrease time constant $T_2^*$ becomes smaller, thereby deteriorating S/N.

Further, since the detected signal decreases exponentially, increase of the measuring time $T$ also results in the deterioration of S/N.

Thus, the more that $G$ and $T$ increase, there results more deterioration of S/N.

SUMMARY OF THE INVENTION

An object of this invention is to provide a means for increasing the spatial resolving power for images without deteriorating S/N.

In order to achieve this object, according to this invention, the positions of sampling points in a plurality of reconstructed images for an identical part are shifted by controlling the center position of a gradient magnetic field in such a manner that the sampling points do not overlap with each other within a sampling interval, thereby increasing the number of sampling points to realize a high resolving power.

BRIEF DESCRIPTION OF THE DRAWINGS

FIG. 2 shows in block diagram an NMR imaging apparatus according to an embodiment of this invention;

FIG. 3 is a flow chart showing the procedure of data processing according to this invention; and FIG. 4 shows a measurement pulse sequence in a projection reconstruction method. cl DESCRIPTION OF THE PREFERRED EMBODIMENTS At first, the principle of this invention will be explained referring to FIGS. 1a and 1b.

FIG. 1a illustrates sampling points on a reconstructed image in the prior art case where the center position of a gradient magnetic field is not changed. FIG. 1b illustrates sampling points on a reconstructed image in the case where the center position of a gradient magnetic field is so controlled that it is uniformly distributed in a pixel. One of symbols such as ○, △, X and □ in FIG. 1 represents the sampling points obtained by one-time's imaging. In the case of FIG. 1b, it was imaged 4 times as a whole and thus a high resolving power is realized.

In the case where values of different sampling points overlap with each other, depending on aperture characteristics of the imaging apparatus, it is also possible to increase further the resolving power by deconvolution treatment, etc.

Figure 1A:
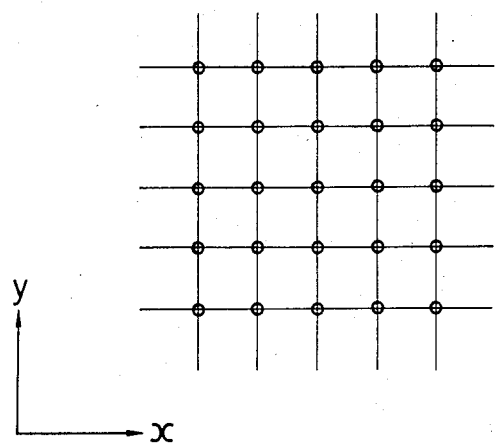
FIGS. 1a and 1b illustrate sampling points for reconstructed images according to the prior art technique and those according to this invention, respectively.
Figure 1B:
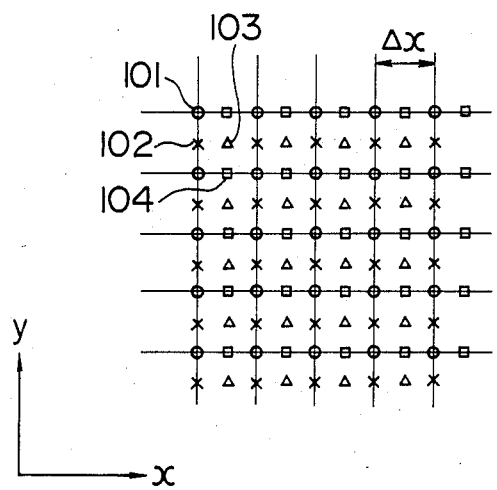

Next, a method for controlling the center position of the gradient magnetic field will be described. When sampling is effected at positions 101–104 as shown in FIG. 1b, the following control is made:

$$\left. \begin{array}{l} \text{Magnitude of shift in } x \text{ direction: } a_1 \cos \theta \\ \text{Magnitude of shift in } y \text{ direction: } a_2 \sin \theta \end{array} \right\} \quad (5)$$

where $\theta$ represents the angle between the resultant gradient magnetic field and the X-axis. Parameters $a_1$ and $a_2$ are set as defined in the following Table 1 in which $\Delta x$ represents the width of a pixel.

TABLE 1

| Parameter | 1st | 2nd | 3rd | 4th |
|---|---|---|---|---|
| $a_1$ | 0 | $\frac{\Delta x}{2}$ | 0 | $\frac{\Delta x}{2}$ |

TABLE 1-continued

| Parameter | 1st | 2nd | 3rd | 4th |
| --- | --- | --- | --- | --- |
| $a_2$ | 0 | 0 | $\frac{\Delta x}{2}$ | $\frac{\Delta x}{2}$ |
| Symbol of position | ○ | □ | × | △ |

By the control stated above, a detected signal as described by equation (6) is obtained. (The term of $T_2$ is neglected, assuming that measurement is effected within a period of time which is so short that influences of $T_2$ are negligebly small.)

$$\vec{f}(t) = K \int \vec{M_0}(x)\exp[-i\gamma\{G_1(x_1 - a\cos\theta) + G_2(x_2 - a\sin\theta)\}t]dx \quad (6)$$

$$= \exp[-i\gamma a\cos(\theta + \alpha)t]\vec{f}(t)$$

where $$a = \sqrt{a_1^2 + a_2^2}, \text{ and}$$

$$\alpha = \cos^{-1}\left(\frac{a_1}{\sqrt{a_1^2 + a_2^2}}\right)$$

Denoting the Fourier Transformation of f(t) by $F(\omega)$, the following relation is obtained:

$$F[\vec{f}(t)] = F(\omega + \gamma a \cos(\theta + \alpha)) \quad (7)$$

That is, a shift based on the trigonometric function is produced in a frequency space.

In the case of a projection reconstruction method, since the angle $\theta$ of the resultant gradient magnetic field varies every time, the center position of projection data changes according to a trigonometric function, and hence the sampling points on reconstructed image are shifted.

In the case of a two-dimensional Fourier transformation method, the angle $\theta$ of the resultant gradient magnetic field does not vary and the sampling points are determined depending on only the initial value of cos $\alpha$.

This invention will now be explained concretely referring to embodiments. FIG. 2 is a block diagram showing an NMR imaging apparatus according to an embodiment of this invention. A sequence controller 201 for controlling various pulses and magnetic fields generated for detecting NMR signals coming from an object or body to be examined controls a transmitter 202 for generating and transmitting high frequency pulses generated to resonate a specified nuclide in the object to be examined; a magnetic field controller 203 for providing control signals for generating a static magnetic field determining the resonance frequency of an NMR signal and gradient magnetic fields having arbitrary directions, whose intensity and position are variable; a magnetic field driver 204 for generating the magnetic filds necessary for measurement on the basis of the control signals outputted by the magnetic field controller 203; a receiver 205 detecting the NMR signals generated from the object to be examined and measuring their intensity; and a processing unit 206 for performing image reconstruction on the basis of detected measurement signals. Images obtained by treating in the processing unit 206 are displayed on a CRT display 207.

A method for realizing this invention by use of the construction decribed above will be explained referring to FIGS. 1 to 4. Here, an example for reconstructing images by a projection reconstruction method using a pulse sequence based on a spin echo method will be described. Further, in this example, measurements of 4 times are performed while shifting the sampling points by a half of the width of a pixel.

A step 301 (see FIG. 3) represents to repeat 4 times steps 302 and 307 while varying or shifting the center position of the gradient magnetic field. The magnitude of the shift is $a_1 \cos\theta$ in the x direction in FIG. 1 and $a_2 \sin\theta$ in the y direction, where $\theta$ indicates the direction of the gradient magnetic field and $a_1$ and $a_2$ take the values shown in Table 1.

In the step 302, steps 303, 304, 305 and 306 are repeated m times (m: the number of projection directions) while varying the angle $\theta$ of the gradient magnetic field.

In the step 303, a slice of the object to be examined is selected by using a 90° pulse 401 shown in FIG. 4. That is, the 90° pulse is emitted by the transmitter 202 on the basis of a control signal coming from the sequence controller 201 and at the same time a gradient magnetic field ($G_z$) 402 in the z direction is generated by commanding the magnetic field driver 204 from the magnetic field controller 203 in accordance with a control signal from the sequence controller 201 (see FIG. 4). By the 90° pulse, only nuclear spins in a specified or selected slice are laid down.

In the step 304, after a period of time of $\tau$, a 180° pulse 403 is emitted by the transmitter 202 in accordance with a control signal from the sequence controller 201 so that the spins are inverted by 180°.

In the step 305, after a further period of time of $\tau$, the magnetic field driver 204 under the control of the magnetic field controller 203 applies a x direction gradient magnetic field (Gx) 404 and an y direction gradient magnetic field (Gy) 405. At this moment, the center position of the gradient magnetic field is shifted by $a_1 \cos\theta$ in the x direction and by $a_2 \sin\theta$ in the y direction, depending on the angle $\theta$ of the gradient magnetic field.

In the step 306, at the same time as the step 305, an NMR signal 406 is detected through the receiver 205 and thereafter sampled.

In the step 307, image processing by the projection reconstruction method is effected on the basis of the data thus obtained. The image processing is carried out through well known procedures of (1) an operation of multiplication with a filter function, (2) a Fourier transformation and (3) a back projection treatment.

When the above steps are carried out 4 times while varying the gradient magnetic field parameters, the lattice points 101 indicated by ○, the lattice points 102 indicated by X, the lattice points 103 indicated by △ and the lattice points 104 indicated by □, as shown in FIG. 1b, can be obtained in an interlace manner independently of each other so that the lattice points do not overlap each other. In a step 308, an image the resolving power of which is increased by a factor 2 in the x and y directions, respectively is obtained by transposing the pixels, as indicated in FIG. 1b.

Although the foregoing has been explained in conjunction with the projection reconstruction method, the resolving power can be also increased by the two-dimensional Fourier transformation method.

Further, when the number of repetitions is n, an image can be obtained which has a resolving power increased by a factor of $\sqrt{n}$ in the x and y directions, respectively.

In the case where it is desired to enlarge only a specified direction e.g. x direction, it is possible to increase the resolving power by a factor n through n repetitions.

Furthermore, it is also possible to ameliorate the image quality by effecting a general treatment in the step 308, taking aperture characteristics of the sampling points.

As is apparent from the above description, according to this invention, it is possible to increase the resolving power and to obtain high resolution images having a high S/N ratio without increasing the gradient magnetic field and/or the measuring time.

The apparatus for realizing this invention is one for which few functions are added to those of the prior art apparatus, such as the means for shifting the center position of the gradient magnetic field. Hence, the inventive apparatus is not expensive at all.

Therefore, this invention permits an increase of the resolving power as large as desired by increasing further the number of measurements without limiting it to 4, and thus to contribute to more precise diagnoses, while satisfying economical requirements.

What is claimed is:

1. A nuclear magnetic resonance imaging method in which a static magnetic field, a plurality of gradient magnetic fields having different directions, and a high frequency magnetic field are applied to an object to be examined to detect a nuclear magnetic resonance signal from said object and to perform an operation of reconstruction of an image corresponding to said object on the basis of the detected signal, said method comprising:
   a step of shifting in an interlace manner the positions of sampling points on reconstructed images within a range smaller than a predetermined sampling interval by controlling independently the center positions of the respective gradient magnetic fields so that the sampling points do not overlap with each other;
   a step of producing cross-sectional images for the respective shifts of sampling points; and
   a step of combining said cross-sectional images for the image reconstruction operation.

2. A nuclear magnetic resonance imaging apparatus comprising:
   magnetic field generating means for generating a static magnetic field, a plurality of gradient magnetic fields having different directions, and a high frequency magnetic field;
   detecting means for detecting a nuclear magnetic resonance signal from an object to be examined;
   operation processing means for performing an operation of reconstruction of an image corresponding to said object on the basis of the detected signal; and
   magnetic field controlling means for varying independently the center positions of the respective gradient magnetic fields to shift the positions of sampling points for reconstructed images within the range smaller than a predetermined sampling interval so that the sampling points do not overlap each other, said operation processing means combining a plurality of cross-sectional images produced for the respective shifts of sampling points to perform the image reconstruction operation.

* * * * *